United States Patent
Huang

(10) Patent No.: US 10,681,806 B2
(45) Date of Patent: Jun. 9, 2020

(54) DISPLAY PANEL AND METHOD OF ASSEMBLING DISPLAY DEVICE HAVING THE SAME

(71) Applicant: Innolux Corporation, Miao-Li County (TW)

(72) Inventor: Kun-Feng Huang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/266,465

(22) Filed: Feb. 4, 2019

(65) Prior Publication Data
US 2019/0289712 A1    Sep. 19, 2019

(30) Foreign Application Priority Data
Mar. 15, 2018 (CN) .......................... 2018 1 0213692

(51) Int. Cl.
| | | |
|---|---|---|
| *H05K 1/02* | (2006.01) | |
| *H05K 1/18* | (2006.01) | |
| *H05K 1/11* | (2006.01) | |
| *G02F 1/1333* | (2006.01) | |

(52) U.S. Cl.
CPC ..... *H05K 1/0281* (2013.01); *G02F 1/133305* (2013.01); *H05K 1/118* (2013.01); *H05K 1/189* (2013.01); *B32B 2457/202* (2013.01); *G02F 2001/133354* (2013.01); *H01L 2251/5338* (2013.01)

(58) Field of Classification Search
CPC ...... H05K 1/0281; H05K 1/118; H05K 1/189; G02F 1/133305; G02F 2001/133354
USPC ......................................................... 174/254
See application file for complete search history.

(56) References Cited

U.S. PATENT DOCUMENTS

| | | |
|---|---|---|
| 2003/0184704 A1 | 10/2003 | Akiyama et al. |
| 2009/0167171 A1 | 7/2009 | Jung et al. |
| 2009/0290113 A1 | 11/2009 | Nakahata et al. |

FOREIGN PATENT DOCUMENTS

EP      2 434 731 A1    3/2012

*Primary Examiner* — Tremesha S Willis
(74) *Attorney, Agent, or Firm* — McClure, Qualey & Rodack, LLP

(57) ABSTRACT

A display panel includes a base having a first surface and a second surface disposed oppositely; a flexible printed circuit board disposed on a first surface of the base and bent toward a second surface of the base; and a mechanical strengthening element disposed on a second surface of the base and at least positioned at regions of the second surface corresponding to two side edges of the flexible printed circuit board.

20 Claims, 8 Drawing Sheets

DISPLAY PANEL AND METHOD OF ASSEMBLING DISPLAY DEVICE HAVING THE SAME

This application claims the benefit of People's Republic of China application Serial No. 201810213692.6, filed Mar. 15, 2018, the subject matter of which is incorporated herein by reference.

BACKGROUND

Technical Field

This disclosure relates to a display panel, and more particularly to a display panel having a mechanical strengthening element, and a method of assembling a display device having the display panel.

Description of the Related Art

Electronic products having display panels have become indispensable necessities for modern human beings in either working, processing and learning, or personal leisure entertainment. In addition to many portable or household small and medium-sized associated products comprising smartphones, tablet computers (pads), notebook computers, monitors and televisions (TVs), display devices used in commercial advertisements or public areas also have display panels.

For example, a display panel comprises docked upper and lower bases, such as glass bases, and the base is connected to a flexible printed circuit board to lead out the traces of the base. Typically, the flexible printed circuit board is bent to adjust the assembling space of the overall display device. However, with the thinning trend of the monitor, when the base is getting thinner and thinner, the stress neighboring the bending position of the flexible printed circuit board is increased therewith.

Thus, in the assembling process, after a period of time from completed assembling has elapsed, or in the used state for a long time, the base tends to be broken from the portion neighboring the flexible printed circuit board.

SUMMARY

This disclosure is directed to a display panel and a method of assembling a display device having the display panel, wherein the mechanical strengthening elements are provided to solve the problem of the excessive stress or stress concentration on a base generated by a flexible printed circuit board connected to the base when the flexible printed circuit board is in a bending process or in a bending status, and thus reduces the possibility of cracking or breaking the base.

According to this disclosure, a display panel is provided. The display panel comprises: a base having a first surface and a second surface disposed oppositely; a flexible printed circuit board disposed on a first surface of the base and bent toward a second surface of the base; and a mechanical strengthening element disposed of a second surface of the base, and at least positioned at regions of the second surface corresponding to two side edges of the flexible printed circuit board.

According to this disclosure, a method of assembling a display device is provided. The method comprises: providing a protection member; providing a display panel comprising a base having a first surface and a second surface disposed oppositely, wherein a flexible printed circuit board is disposed on a first surface of the base; bonding the display panel to the protection member; disposing a mechanical strengthening element of a second surface of the base, wherein the mechanical strengthening element is at least positioned at regions corresponding to two side edges of the flexible printed circuit board; and bending the flexible printed circuit board backwardly toward the second surface of the base after the mechanical strengthening element is disposed.

The above and other aspects of the disclosure will become better understood with regard to the following detailed description of the embodiments but non-limiting embodiments. The following description is made with reference to the accompanying drawings.

BRIEF DESCRIPTION OF THE DRAWINGS

FIG. 1A and FIG. 1B are schematic views showing a display panel disposed on a protection member according to an embodiment of this disclosure, wherein FIG. 1A is a schematic view showing a flexible printed circuit board of the display panel before being bent, and FIG. 1B is a schematic view showing the flexible printed circuit board after being bent.

DETAILED DESCRIPTION

Figure 1A:
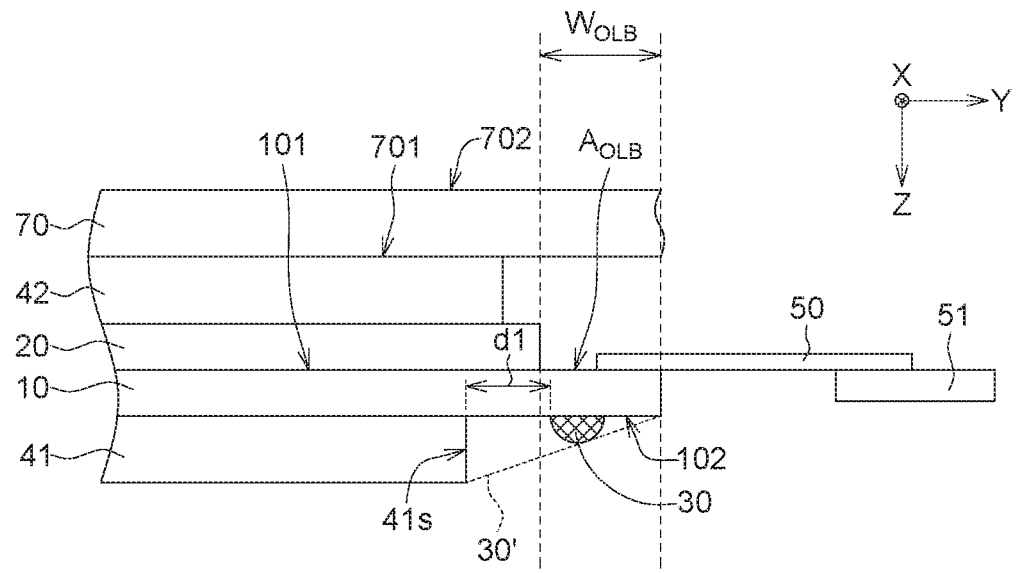

The embodiment of this disclosure discloses a display panel provided with a mechanical strengthening element to prevent a base of the display panel from getting scrapped in an assembling process, after being assembled, or the panel is stored or used for a long time. The embodiment of this disclosure further discloses a display device having the display panel, and a method of assembling the display device. Furthermore, the display panel having the mechanical strengthening element according to the embodiment of this disclosure may be a flat panel display, a curved display device or a display device having an irregular shape, wherein the applied curved display device may comprise the display panel having various curvatures. Furthermore, the display panel of this embodiment may be applied to any display product. Because the bent flexible printed circuit board is free from the problem of the scrapped position connected to the base, the display panel of this embodiment is also applicable to a display product having a borderless full screen display.

Hereinafter, various aspects of this disclosure will be described in detail with reference to the accompanying drawings. It should be noted that the structures, processes, and contents of the aspects presented in the embodiments are for illustrative purposes, and that the scope of the disclosure is not limited to the stated aspects. It should be noted that the disclosure does not show all possible embodiments, and the structures and processes of the embodiments may be changed and modified to satisfy the needs of the actual application without departing from the spirit and scope of this disclosure. Therefore, other aspects not presented in this disclosure may also be applied. Furthermore, the same or similar reference numerals in the embodiments are used to indicate the same or similar parts.

Furthermore, the terms, such as "first", "second", "third" and the like, are used in the specification and the claims to modify the elements of the claim, and it does not mean that it has any previous ordinal numbers on behalf of the claimed element, and also does not represent the order of a claimed element and another claimed element, or the order in the manufacturing method. These ordinals are used to make a claimed element with a certain name clearly distinguishable from another claimed element with the same name. In addition, when a first material layer is mentioned to be disposed on, above or over a second material layer, it may include direct contact between the first material layer and the second material layer unless particularly defined. Alternatively, it is also possible to have one or more layers of other materials interposed, in which case there may be no direct contact between the first material layer and the second material layer.

According to an embodiment of this disclosure, at least one flexible printed circuit board comprised in a display panel is disposed on a first surface of a base, and a mechanical strengthening element (e.g., a glue) is disposed on a second surface of the base and at least corresponds to regions of two sides of the flexible printed circuit board, wherein the flexible printed circuit board is bent toward the second surface of the base, and the first surface and the second surface are two opposite surfaces of the base, such as an upper surface and a lower surface. The flexible printed circuit board may be, for example, a flexible printed circuit board (FPC), a chip on film (COF), or other circuit boards that can be bent and bonded with the base.

Figure 1B:
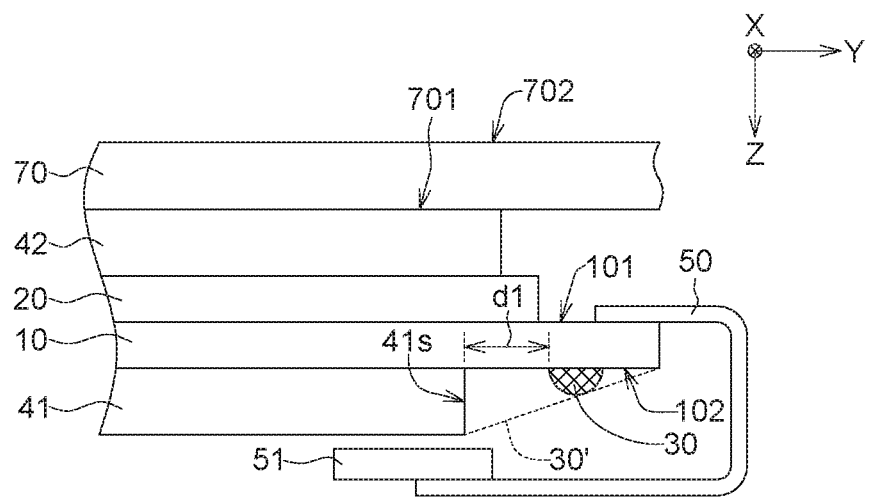

FIG. 1A and FIG. 1B are schematic views showing a display panel disposed on a protection member according to an embodiment of this disclosure, wherein FIG. 1A is a schematic view showing a flexible printed circuit board of the display panel before being bent, and FIG. 1B is a schematic view showing the flexible printed circuit board after being bent. Please refer to FIG. 1A and FIG. 1B at the same time.

In an embodiment, a display panel comprises a first base 10, a second base 20 disposed opposite to the first base 10, a lower polarizer 41 and an upper polarizer 42 respectively disposed outside the first base 10 and the second base 20, a flexible printed circuit board 50 disposed on a first surface 101 (or referred to as a front side) of the first base 10, and a mechanical strengthening element 30 disposed on a second surface 102 (or referred to as a backside) of the first base 10. The mechanical strengthening element 30 is at least positioned at partial regions of the second surface 102 corresponding to two side edges (such as the first side edge 501 and the second side edge 502 in FIG. 2) of the flexible printed circuit board 50. In an example, thin film transistors or trace related elements may be disposed on the first base 10, and at least one of multiple color filter units, a planarization layer, a black matrix layer and a spacer may be selectively disposed on the second base 20; but may also be selectively disposed on the first base 10 according to the requirement without being particularly restricted. The display panel may be disposed in correspondence with a protection member 70, which may be, for example, protection glass or a transparent plastic plate. In addition, the other end of the flexible printed circuit board 50 may also be connected to another circuit board 51, which may be, for example, a printed circuit board (PCBA) provided with elements.

The material of the first base 10 may be, for example, glass, acrylic, PI, PET or other materials suitable for the first base. The material of the second base may be, for example, glass, acrylic, PI, PET or the like; or inorganic-organic protection layers alternately stacked to form a multi-layer insulating layer, a water-oxygen barrier layer or a water barrier film.

In other embodiments, the lower polarizer 41 and the upper polarizer 42 are integrated with the first base and the second base, respectively, and are directly made on the base by exposing and etching processes and the like to form a wire grid polarizer. In another embodiment, the upper polarizer and the lower polarizer may be selectively formed on different surfaces of the base. For example, the lower polarizer is directly disposed on the first surface, and the upper polarizer is also selectively and directly disposed on a surface of the second base close to the first surface.

In an embodiment of the liquid crystal display, a liquid crystal layer functioning as a display medium layer may be disposed between the first base 10 and the second base 20. However, in an embodiment of a light emitting diode monitor, the lower polarizer 41 may be omitted, and the upper polarizer 42 may be selectively changed to a quarter wave plate. However, the light emitting diode functioning as the display medium layer may be, for example, an OLED, a QLED, a microLED or a miniLED.

In an example, the mechanical strengthening element is, for example, a glue. Furthermore, the glue is, for example, a light curing glue, a heat curing glue or a chemical reaction curing glue. In addition, the glue may be a transparent glue, a black glue or a glue with any color according to the design requirement. In an example, the light curing glue is, for example, a ultra-violet (UV) cured resin. In an example, the heat curing glue is, for example, a thermal cured resin. In an example, the chemical reaction curing glue is, for example, a polymerization cured glue. For example, cyanoacrylate rapidly polymerizes with water in air at the room temperature, and then is harden into an adhesive agent with the predetermined structural strength in a short time. Alternatively, A and B liquid glues (the so called AB glues) are mixed and react to form a polymer and cure. The cured glue can increase the mechanical strength of the to-be-adhered object, and the structure thereof also has a predetermined rigidity. Furthermore, because the solvent volatilizes in the curing process can make the molecules of the adhesive agent get closer, or generate new chemical bonds to make the structure become denser, the cured glue cannot easily crack. In an example, the cured glue has a rigidity ranging from about 0.1 GPa to about 20 GPa.

Furthermore, as shown in FIG. 1A and FIG. 1B, a side surface (e.g., on the Y-Z plane) of the mechanical strengthening element (e.g., the glue) 30 is in the shape of an arced protrusion. In other words, a cross section of the mechanical strengthening element (e.g., the glue) 30 perpendicular to the first surface 101 of the first base 10 (e.g., the first surface of the first base extends on the X-Y plane) has at least one arced protrusion.

Regarding the relative position of the mechanical strengthening element and the lower polarizer 41, the mechanical strengthening element (e.g., the glue) 30 may abut upon the lower polarizer 41 or is separated from the lower polarizer 41 by a distance, but does not extend to the surface of the lower polarizer 41 neighboring the display region to prevent the display quality from being affected. As shown in FIG. 1A, in an embodiment, a mechanical strengthening element (e.g., the glue 30 drawn by the solid line) neighbors the lower polarizer 41 and is separated from the lower polarizer 41 by at least a distance d1. Furthermore, in an embodiment, the mechanical strengthening element 30 may contact one side surface 41s of the lower polarizer 41 (e.g., the coating range of the mechanical strengthening element 30 is larger), and have at least one arced protrusion. Two conditions are applicable. In an embodiment, the width of the lower polarizer 41 is smaller than that of the upper polarizer 42, as shown in FIG. 1A, and the side surface 41s of the lower polarizer 41 is retracted much more inwardly than the side surface 42s of the upper polarizer 42 in the direction away from the flexible printed circuit board 50. Furthermore, in an embodiment of this example, the mechanical strengthening element may also be a glue 30' fully coated on a triangular region formed by the dashed line, one side surface 41s of the lower polarizer 41 and the second surface 102 of the first base 10.

In the embodiment, the position of the mechanical strengthening element 30/30' disposed on or coated on the second surface 102 of the first base 10 should correspond to the position of the flexible printed circuit board 50 to decrease the stress generated on the first surface 101 of the first base 10 upon bending of the flexible printed circuit board 50, and to avoid scrapping. For example, the mechanical strengthening element 30/30' is disposed at two corners corresponding to the side edge of the flexible printed circuit board 50, corresponding to the whole side edge of the flexible printed circuit board 50, or corresponding to any position that generates the extreme stress upon bending of the flexible printed circuit board 50.

Figure 2:
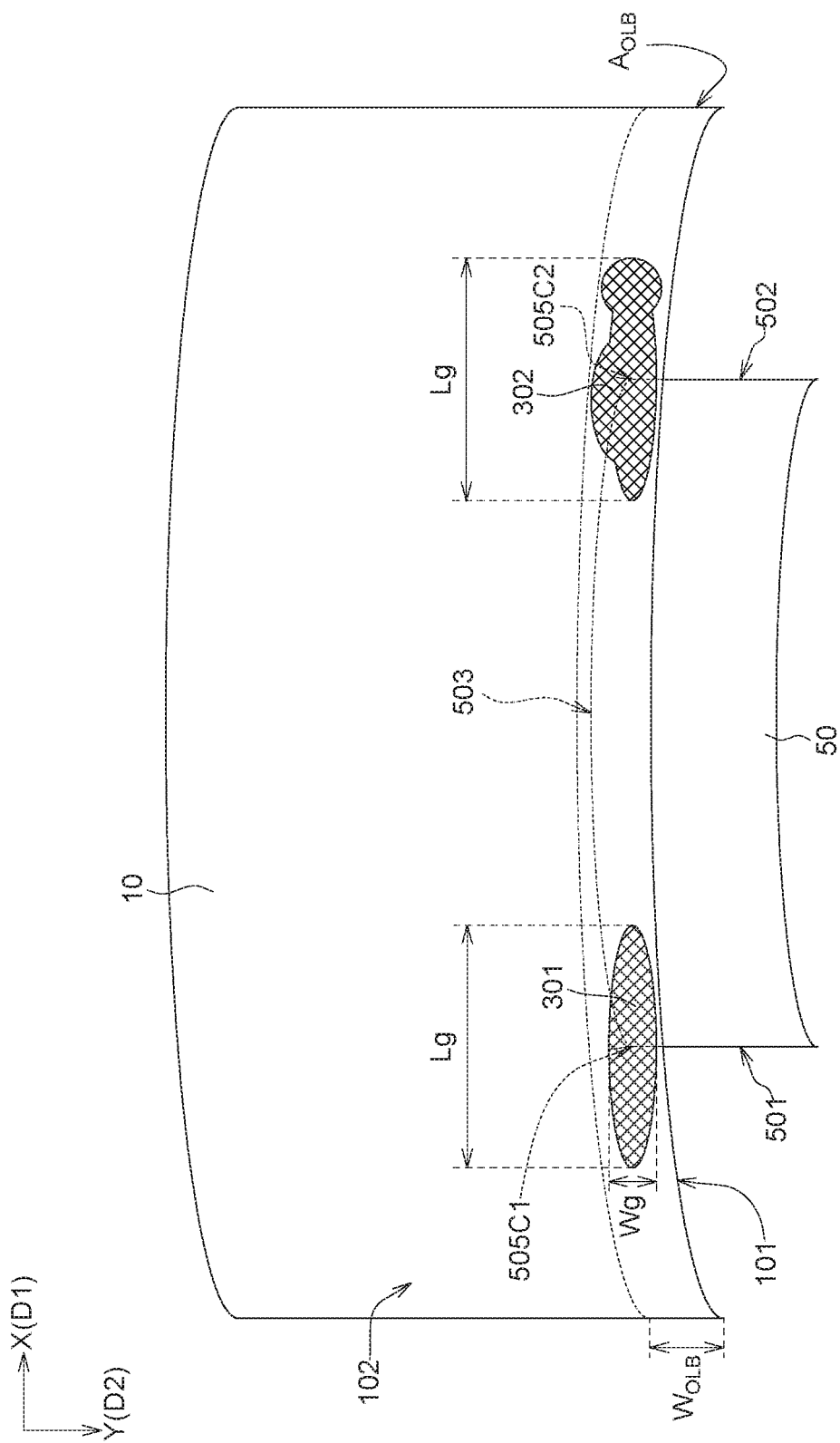
FIG. 2 is a partial top view showing a base of a display panel and the display panel according to an embodiment of this disclosure.

FIG. 2 is a partial top view showing a base of a display panel and the display panel according to an embodiment of this disclosure. In an embodiment, the flexible printed circuit board 50 has a first side edge 501 and a second side edge 502 opposite to each other, and a third side edge 503 having two connecting ends respectively connected to the first side edge 501 and the second side edge 502. The third side edge 503, a portion of the first side edge 501 of the flexible printed circuit board 50 and a portion of the second side edge 502 of the flexible printed circuit board 50 overlap with the first base 10 in the top view of the first base 10. The mechanical strengthening element 30 (e.g., the glue) is at least positioned at a first corner 505C1 corresponding to one of the connecting ends between the first side edge 501 of the flexible printed circuit board 50 and the third side edge 503 of the flexible printed circuit board 50, and a second corner 505C2 corresponding to the other one of the connecting ends between the second side edge 502 and the third side edge 503. For example, in this embodiment, the mechanical strengthening element 30 (e.g., the glue) located at the second surface 102 of the first base 10 comprises a first part 301 and a second part 302, wherein the first part 301 corresponds to the first corner 505C1 connecting the first side edge 501 of the flexible printed circuit board 50 to the third side edge 503 of the flexible printed circuit board 50, and the second part 302 corresponds to the second corner 505C2 connecting the second side edge 502 to the third side edge 503. As shown in FIG. 2, the first part 301 correspondingly shields a portion of the first side edge 501 of the flexible printed circuit board 50 and a portion of the third side edge 503 of the flexible printed circuit board 50 connected to the first corner 505C1, and the second part 302 correspondingly shields a portion of the second side edge 502 of the flexible printed circuit board 50 and a portion of the third side edge 503 of the flexible printed circuit board 50 connected to the second corner 505C2.

Of course, this disclosure is not limited to the aspect as shown in FIG. 2. In other embodiments, the position of the mechanical strengthening element 30 (e.g., the glue) may correspond to the whole side edge and corner of the flexible printed circuit board 50. For example, the mechanical strengthening element 30 may also correspondingly shield the whole third side edge 503 in addition to the positions of the first part 301 and the second part 302 as shown in FIG. 2. That is, the mechanical strengthening element 30 is correspondingly coated on and shields the whole third side edge 503 so that the first part 301 and the second part 302 cannot be distinguished from each other. In another embodiment, for example, the first part 301 may extend to one of the lateral sides (such as the lateral side 1001/1002/1003/1004 shown in FIG. 5) of the first base 10. That is, the first part 301 is correspondingly fully coated on and shields the overlapped portion that the first side edge 501 of flexible printed circuit board 50 and the first base 10 are overlapped. The above-mentioned coating aspects can be arranged in any combination, and are not limited thereto.

The top-view shape of mechanical strengthening element 30 of this disclosure is determined according to the aspect, in which the mechanical strengthening element is actually disposed. For example, if the mechanical strengthening element is the glue, then the top-view shape, cross section shape, position and dimension of the coating glue are determined according to the requirement, so that different structure strengthening conditions and support forces can be provided. In an embodiment, at least a portion of the shape of the mechanical strengthening element 30 (e.g., the glue) is arced in a top view of the mechanical strengthening element 30 (e.g., the glue). For example, in FIG. 2, the top-view shapes of the first part 301 and the second part 302 have arced edges, respectively. In an embodiment, two ends of the glue at the same location may have different shapes (e.g., one end is a cuspidal tail end and the other end is a circular tail end; or the two ends have approximate shapes). Taking the second part 302 as an example, the left end is a cuspidal tail end, and the right end is a circular glue tail. Of course, it may also be an approximate elliptic shape like the top-view shape as shown in the first part 301, or other possible shapes.

Furthermore, in an example, the flexible printed circuit board 50 is disposed on an outer lead bonding (OLB) area $A_{OLB}$ on the first surface 101 of the first base 10, and the mechanical strengthening element (e.g., the second part 302) disposed on the second surface 102 may have different widths, wherein a ratio of its maximum width Wg to a width $W_{OLB}$ of the outer lead bonding area $A_{OLB}$ ranges from 0.8 to 2.0, for example, and a ratio of its length Lg to the width $W_{OLB}$ of the outer lead bonding area $A_{OLB}$ ranges from 3 to 8. In another embodiment, the mechanical strengthening element has a width ranging from 2 mm to 7 mm, and a length ranging from 8 mm to 25 mm. In addition, in an example, the mechanical strengthening element has a width ranging from 3 mm to 5 mm, and a length ranging from 15 mm to 18 mm. Of course, the dimensions of the mechanical strengthening element, such as the length, the width and the like, may be correspondingly modified and changed according to the actual application requirements, and this disclosure is not particularly limited thereto.

Figure 3A:
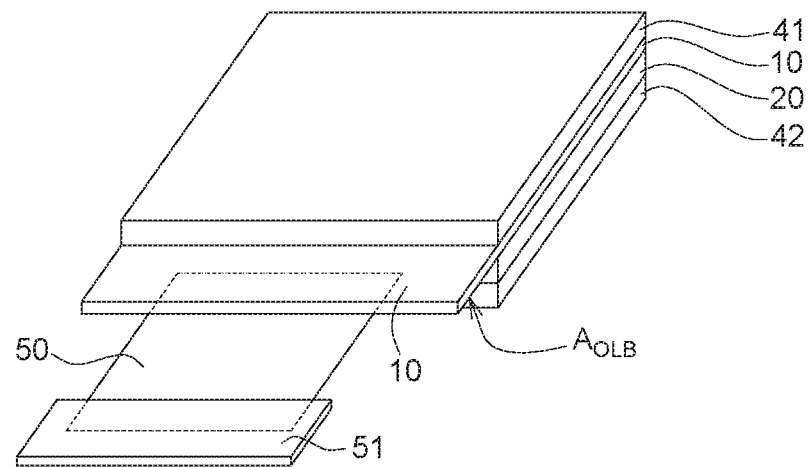
FIG. 3A to FIG. 3C show a method of assembling a display panel with a protection member according to an embodiment of this disclosure.
Figure 3A:
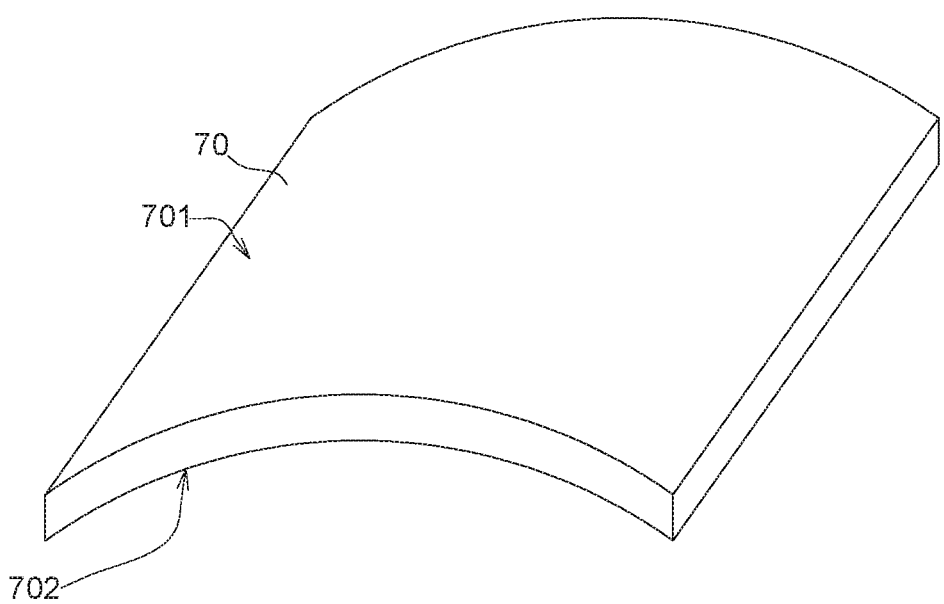
Figure 3B:
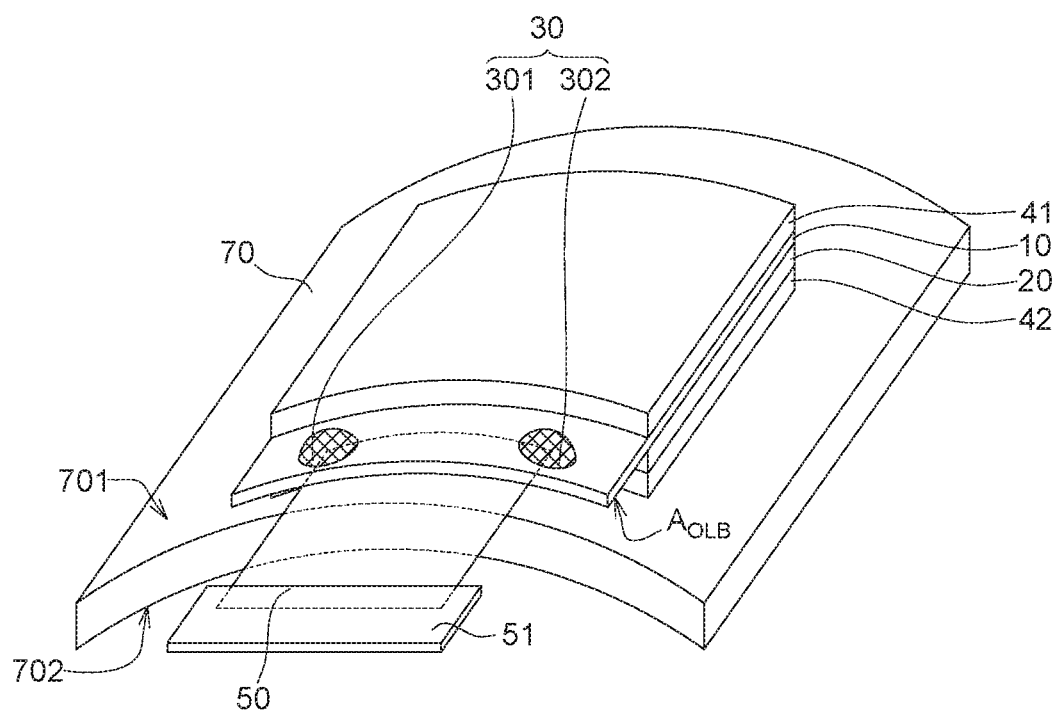
Figure 3C:
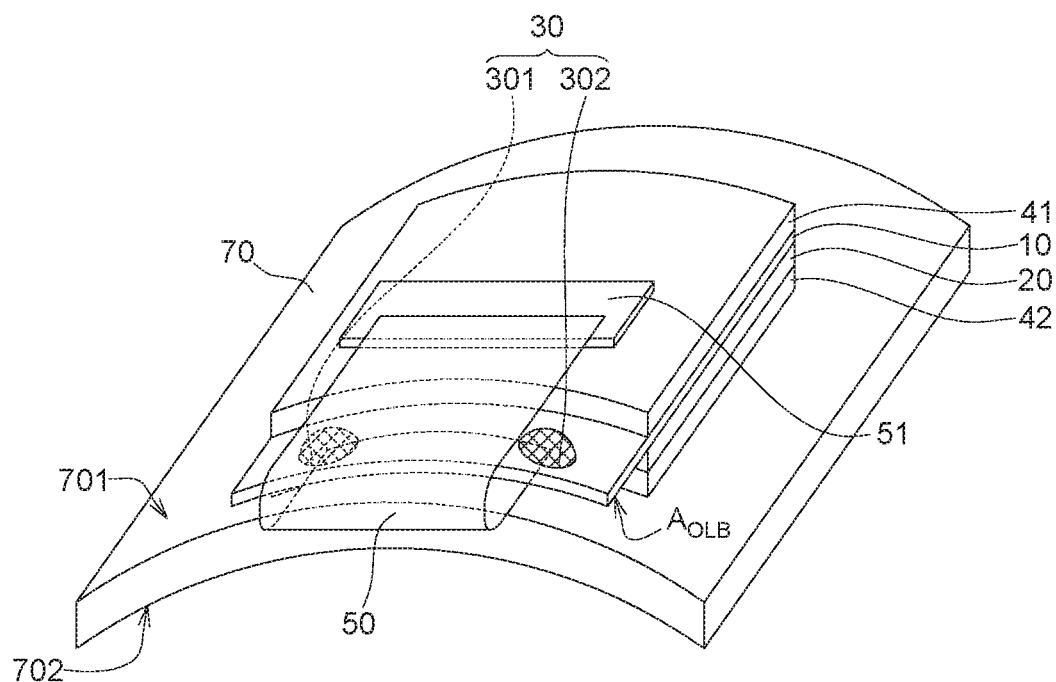

FIG. 3A to FIG. 3C show a method of assembling a display panel with a protection member according to an embodiment of this disclosure. In an embodiment, a method of assembling the display device comprises the following steps, for example. As shown in FIG. 3A, a protection member 70 is provided, wherein the protection member 70 has an inner surface 701 and an outer surface 702 opposite to each other, and the protection member 70 at least has a curved surface, for example. One of the above-mentioned display panels is provided, and the display panel comprises the first base 10 and a flexible printed circuit board 50 disposed on the first surface 101 of the first base 10 (e.g., a TFT base). Then, the display panel is bonded to the protection member 70, as shown in FIG. 3B.

In an example, the protection member 70 at least has a curved surface, the display panel provided is, for example, a flat display panel (FIG. 3A), and the display panel is bonded to the protection member having the curved surface (e.g., the upper polarizer 42 is attached to the inner surface 701 of the protection member 70) upon bonding, so that the display panel presents a curvature corresponding to the curved surface of protection member 70. Therefore, those skilled in the art should know that FIG. 3B depicts one applicable shape of the protection member 70, and this disclosure is not restricted thereto. Upon practical application, the shape of the protection member 70 is determined according to the requirement of the applied products, and the display panel after being bonded to the protection member 70 also presents a state corresponding to the shape of the protection member 70.

Next, as shown in FIG. 3C, the mechanical strengthening element 30 is disposed on the second surface 102 of the first base 10, and the mechanical strengthening element 30 is at least provided (coated) in partial regions corresponding to two side edges (such as the first side edge 501 and the second side edge 502) of the flexible printed circuit board 50. In an example, the mechanical strengthening element 30 is a glue, such as a glue strip, a light curing glue, a heat curing glue or a chemical reaction curing glue. After the mechanical strengthening element 30 is disposed, the flexible printed circuit board 50 is bent backwardly toward the second surface 102 of the first base 10. Furthermore, in an example, after the mechanical strengthening element 30 (e.g., the glue) is disposed, if the mechanical strengthening element 30 is a light curing glue, then an ultra-violet light source may be provided to irradiate and cure the mechanical strengthening element 30. It is worth noting that the mechanical strengthening element 30 is disposed after the display panel is bonded to the protection member 70 and before the flexible printed circuit board 50 is bent in order to strengthen the first base 10 against the stress generated on the surface of the first base 10 upon bending of the flexible printed circuit board 50, and to avoid scrapping.

Aspects of several applicable display devices in this disclosure are explained in the following by taking the above-mentioned display panel as an example. Of course, applicable display devices in this disclosure are not limited to the following exemplified aspects, and may have the corresponding configuration for associated elements in the display device according to the practical application.

Figure 4A:
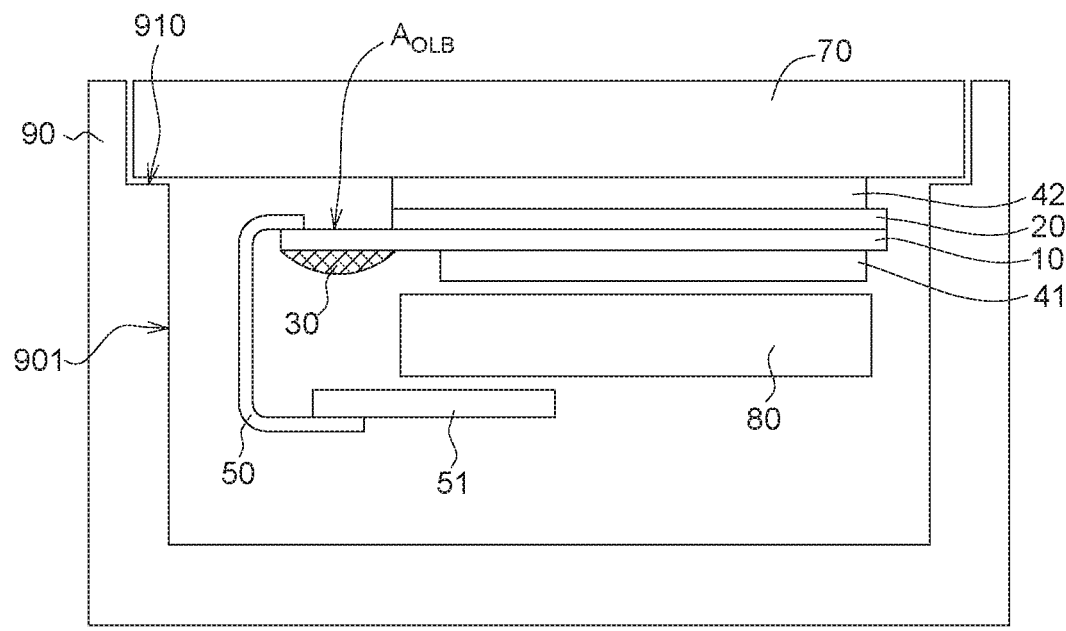
FIG. 4A is a schematically cross-sectional view showing a display device having the display panel of this disclosure.

FIG. 4A is a schematically cross-sectional view showing a liquid crystal display device having the display panel of this disclosure. The same or similar symbols denote the same or similar elements in FIG. 4A and FIG. 1A, the relevant contents can be obtained from the above-mentioned descriptions, and detailed descriptions thereof will be omitted here. In an application example, a display device comprises a frame 90, a protection member 70 supported in a slot 910 of the frame 90, and one of the above-mentioned display panels, which comprises the first base 10, the second base 20, the lower polarizer 41 and the upper polarizer 42, for example, wherein the liquid crystal layer (not shown) functioning as the display medium layer is disposed between the first base 10 and the second base 20. The display panel is disposed on the protection member 70 and located in the space surrounded by the frame 90, and the mechanical strengthening element 30 (e.g., the glue) is separated from one side wall 901 of the frame 90 by a distance and does not directly contact the side wall 901. Furthermore, the display device may further comprise, for example, a backlight module 80 (comprising a light source and an optical film layer) under the display panel. As shown in FIG. 4A, the bent flexible printed circuit board 50 can be wound to the rear side of the first base 10 (e.g., the side facing the second surface 102), and another circuit board 51 may be located below the backlight module 80.

Figure 4B:
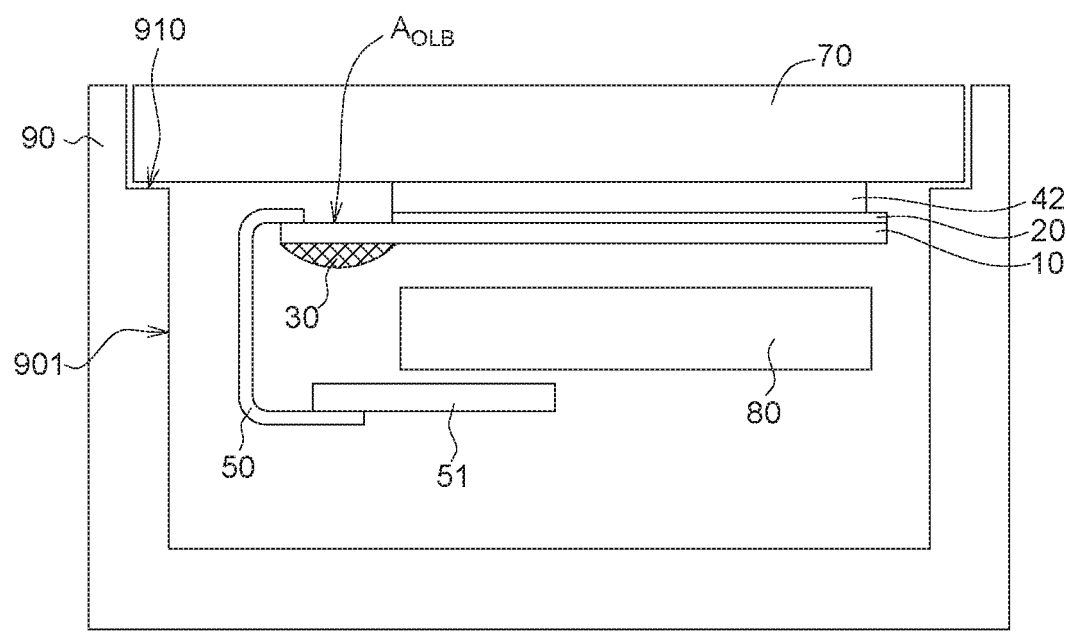
FIG. 4B is a schematically cross-sectional view showing a light-emitting diode display device having the display panel of this disclosure.

FIG. 4B is a schematically cross-sectional view showing a light-emitting diode display device having the display panel of this disclosure. The same or similar symbols denote the same or similar elements in FIG. 4B and FIG. 1A, the relevant contents can be obtained from the above-mentioned descriptions, and detailed descriptions thereof will be omitted here. In an application example, a display device comprises a frame 90, a protection member 70 supported in a slot 910 of the frame 90, and one of the above display panels. In one example, the display panel may comprise the first base 10, the second base 20 and the upper polarizer 42, for example, wherein light emitting diode elements (not shown) functioning as the display medium layer are disposed between the first base 10 and the second base 20. In this embodiment, the upper polarizer 42 may be a 1/4λ polarizer or a circular polarizer. In an embodiment, a touch layer (not shown) may be located between the second base 20 and the upper polarizer 42. In another embodiment, a touch layer (not shown) may be located between the upper polarizer 42 and the protection member 70. In still another embodiment, an anti-shatter film (not shown) may be disposed between the upper polarizer 42 and the protection member 70.

Of course, the position of each element as shown in FIG. 4A and FIG. 4B may be arranged according to actual application conditions. Furthermore, one single flexible printed circuit board 50 is explained as an example in the drawings. Upon the practical application, however, there may be multiple flexible printed circuit boards 50, which can be typically connected to a base (e.g., TFT base).

Figure 5:
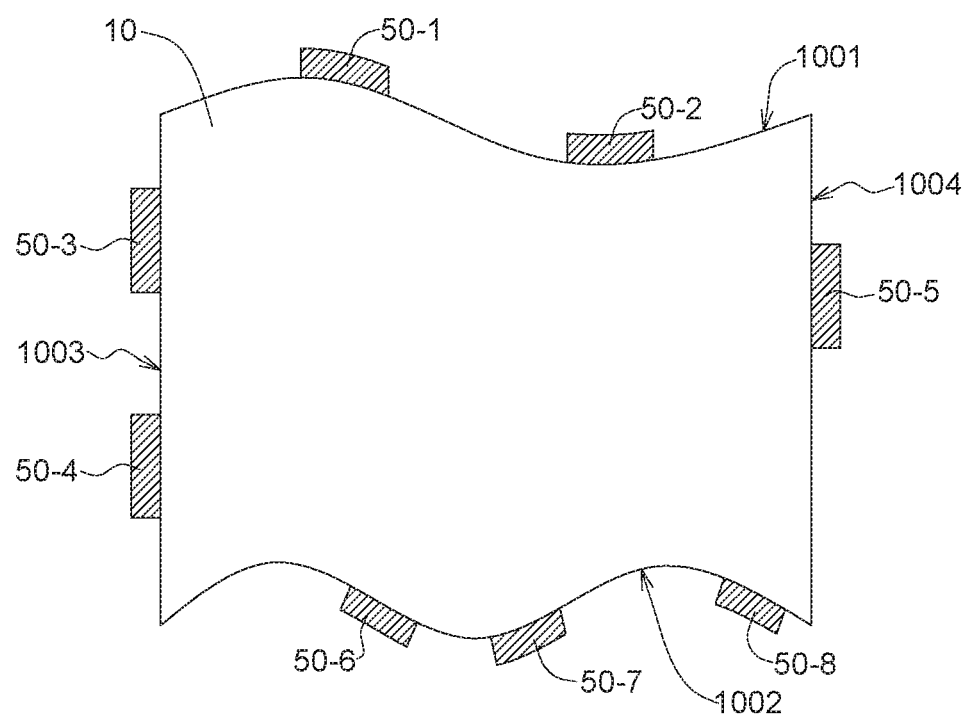
FIG. 5 is a schematic view showing a base and multiple flexible printed circuit boards in a display panel according to an embodiment of this disclosure.

FIG. 5 is a schematic view showing a base and multiple flexible printed circuit boards in a display panel according to an embodiment of this disclosure. In the example, a display panel comprises multiple flexible printed circuit boards, such as 50-1 to 50-8, respectively disposed on the first base 10 (e.g., the first surface 101 as mentioned hereinabove), and these flexible printed circuit boards (e.g., 50-1 to 50-8) may be bent backwardly (e.g., bent toward a second surface 102 of the base as mentioned hereinabove). In an embodiment, the first base 10 has multiple lateral sides, the distribution of these flexible printed circuit boards corresponds to one lateral side or multiple lateral sides of these lateral sides of the first base 10, the number, position, shape, type and manner of the distribution of the flexible printed circuit boards 50 are not limited, and the numbers of the flexible printed circuit boards corresponding to the lateral sides of the first base 10 may be equal or unequal. As shown in FIG. 5, the flexible printed circuit boards 50-1 and 50-2 (two in total) are distributed on a first lateral side 1001 of the first base 10, and the flexible printed circuit boards 50-1, 50-2 and 50-3 (three in total) are distributed on a second lateral side 1002 (relative to the first lateral side 1001), so that different numbers are present. Furthermore, the distribution gap of adjacent flexible printed circuit boards 50 is not limited, and the distances between multiple two of the adjacent flexible printed circuit boards 50 may be equal or unequal. The number and the distribution gap of the flexible printed circuit boards 50 may be appropriately adjusted and determined according to the actual application requirements.

Furthermore, in an embodiment, the base (e.g., the first base 10) is at least partially arced (curved). For example, in the practical application when viewed at a stereoscopic angle, the first base 10 may have a rugged surface. For example, the first base 10 may have some partial curved protrusions or depressions. The surface of the base is determined according to the external shape of the product when the display panel of the embodiment is applied to the product. Furthermore, in an embodiment, in a top view of the base, the applicable shape of the base is also not particularly restricted, may be a regular shape (e.g., rectangular or circular shape) or may also be an irregular shape, or a portion of the lateral sides is a straight line and the other portions of the lateral sides are curved. Thus, all lateral sides of the applicable base may have the same or different curvatures. As shown in FIG. 5, two lateral sides of the first base 10, such as the first lateral side 1001 and the second lateral side 1002, have different curvatures, or may have different numbers of arced sections. Furthermore, different from the curved lateral sides of the first lateral side 1001 and the second lateral side 1002, a third lateral side 1003 and a fourth lateral side 1004 are straight lines, or may also selectively have arced sections.

In addition, one single side in the embodiment may also have multiple different curvatures, and can be determined by meeting the shape of the object of the display panel of this embodiment according to the requirements upon the practical application. For example, if the display panel in the embodiment is applied to a cylinder, an arced building exterior, a car, a game device, an advertising billboard, a mobile phone, a watch or any object with the regular or irregular shape, then the suitable curvature and curvature variation are determined by following the display panel bonded to the surface of the object according to the up and down trends at the corresponding position of the surface of the object. As shown in FIG. 5, the first lateral side 1001 of the first base 10 has multiple different curvatures, the second lateral side 1002 also has multiple different curvatures, and the bending states of the first lateral side 1001 and the second lateral side 1002 are independently determined according to the up and down trends of the surface of the applied object.

The display panels of the embodiment in this disclosure may be many different types of display panels, such as the touch display panels. Application aspects of several display devices are explained in the following. In addition, although the drawings of the following application aspects are similar to the display device in FIG. 4A, these drawings function as examples for explanation, and do not intend to limit the applicable structures in this disclosure.

Figure 6A:
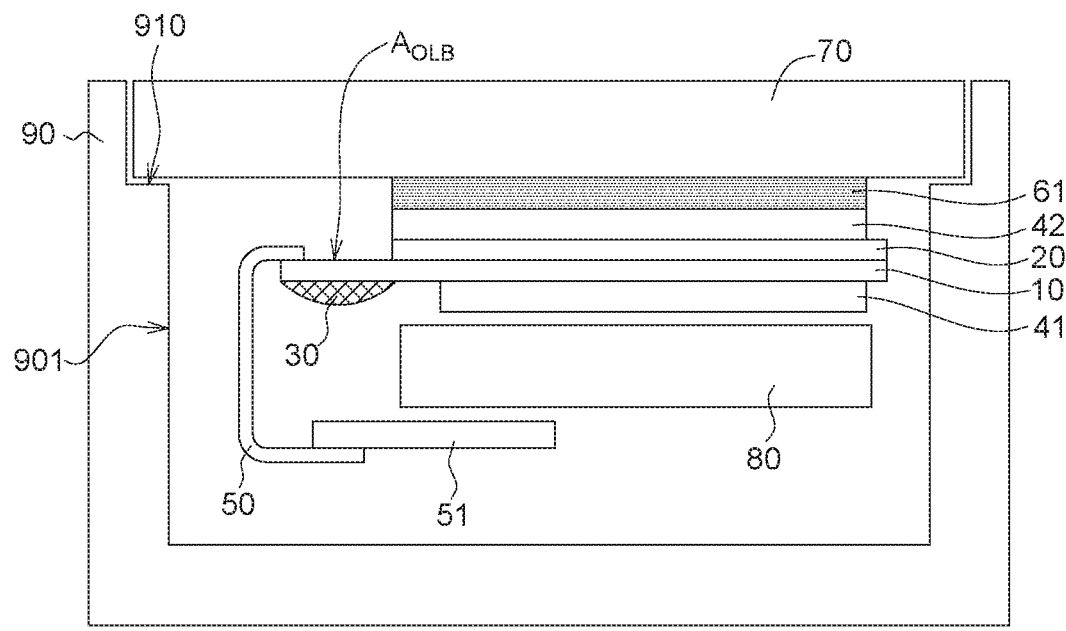
FIG. 6A is a schematically cross-sectional view showing a display device according to an application aspect of this disclosure.

FIG. 6A is a schematically cross-sectional view showing a display device according to an application aspect of this disclosure. In the application aspect, the display panel further comprises an anti-shatter film 61 which may be disposed between the protection member (e.g., the protection glass) 70 and the upper polarizer 42. The same or similar symbols denote the same or similar elements in FIG. 6A and FIG. 4A, the relevant contents can be obtained from the above-mentioned descriptions, and detailed descriptions thereof will be omitted here.

Figure 6B:
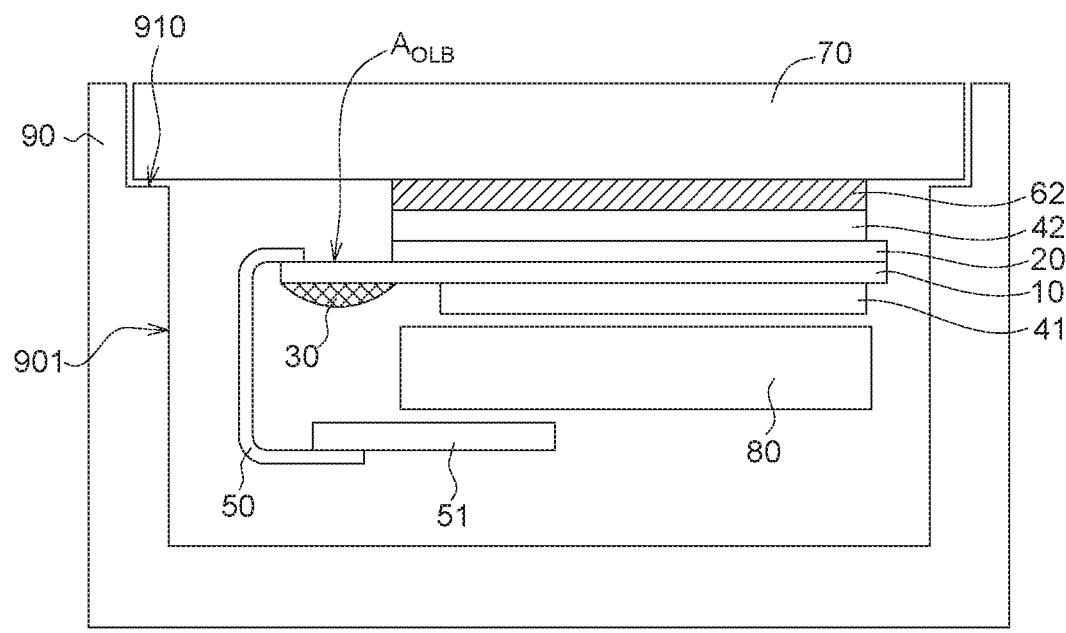
FIG. 6B is a schematically cross-sectional view showing a first touch display device according to another application example of this disclosure.

FIG. 6B is a schematically cross-sectional view showing a first touch display device according to another application example of this disclosure. In the application aspect, the display panel further comprises a touch layer 62 which may be disposed between the protection member (e.g., the protection glass) 70 and the upper polarizer 42. The same or similar symbols denote the same or similar elements in FIG. 6B and FIG. 4A, the relevant contents can be obtained from the above-mentioned descriptions, and detailed descriptions thereof will be omitted here. Because the position of the touch layer 62 is located outside the upper polarizer 42, and a touch layer (or touch assembly) is superimposed on the outside of the display panel, this touch display device is named as an out cell touch display device.

In addition to the application of the out cell touch display device, the touch display device in this disclosure may be, for example, a touch on display (TOD) touch display device (e.g., the touch layer is disposed on the upper surface of the second base 20 away from the display medium layer); or may be, for example, a touch in display (TID) touch display device or a hybrid touch display device (e.g., at least a portion of the touch layer is directly disposed on a surface of the first base 10 or the second base 20 neighboring the display medium layer).

Figure 7:
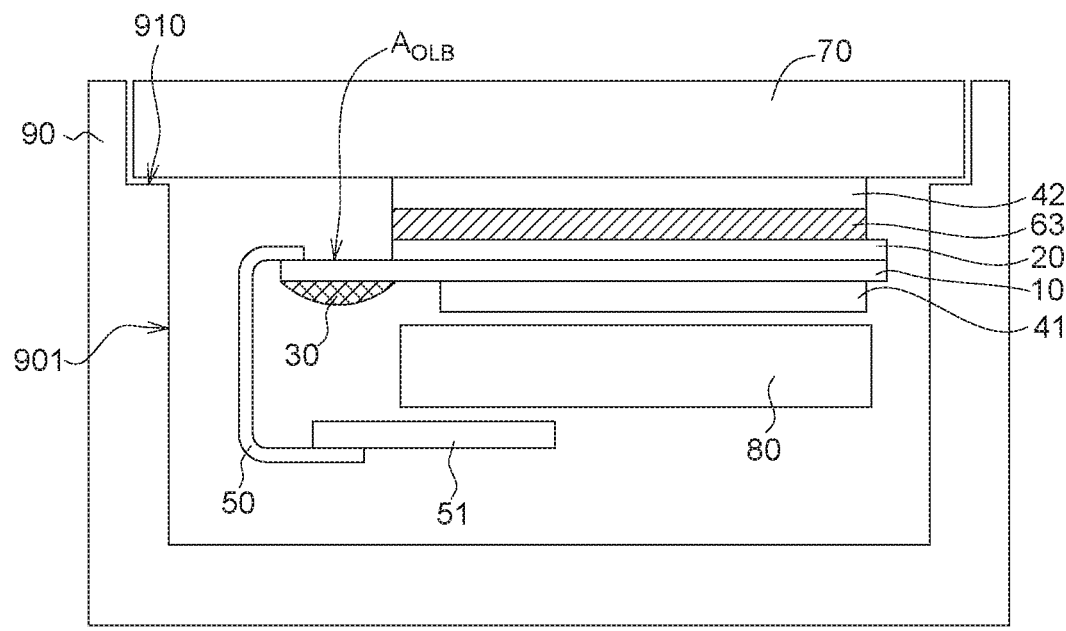
FIG. 7 is a schematically cross-sectional view showing a second touch display device according to still another application example of this disclosure.

FIG. 7 is a schematically cross-sectional view showing a second touch display device according to still another application example of this disclosure. In the application aspect, the display panel further comprises a touch layer 63 disposed on the upper surface of the second base 20. That is, the touch layer 63 is located between the protection member 70 and the second base 20. Therefore, FIG. 7 is a TOD touch display device.

Figure 8:
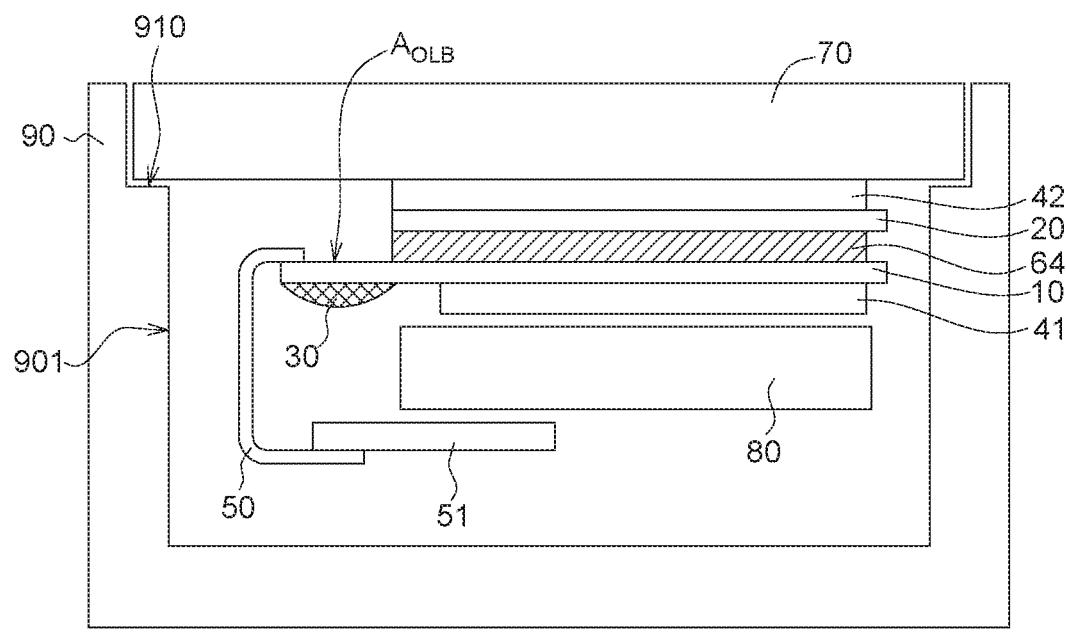
FIG. 8 is a schematically cross-sectional view showing a third touch display device according to yet still another application example of this disclosure.

FIG. 8 is a schematically cross-sectional view showing a third touch display device according to yet still another application example of this disclosure. In the application aspect, the display panel further comprises a touch layer 64 disposed on the first base 10. That is, the touch layer 64 may be at least partially located between the first base 10 and the second base 20, and may be selectively disposed on the first base 10 or the second base 20, but this disclosure is not restricted thereto and can be modified according to the design requirements. Therefore, FIG. 8 is a TID touch display device. In another embodiment, in addition to at least a portion of the touch layer 64 located between the first base 10 and the second base 20, the touch layer 64 further has at least another portion located on the upper surface of the second base 20, and a hybrid touch display device is present at this time. Similarly, in the above-mentioned touch display devices as shown in FIG. 6 to FIG. 8, the mechanical strengthening element 30 (e.g., the glue) comprised in the display panel to be applied is also positioned at regions at least corresponding to two side edges of the flexible printed circuit board to decrease the stress generated on the base upon bending of the flexible printed circuit board, and to reduce the scrapped conditions.

Therefore, according to the display panels of the above-mentioned embodiments, the provision of the mechanical strengthening element solves the problem of the excessive stress of the base connected to a flexible printed circuit board in the bending process, and thus prevents the base of the display panel from getting scrapped in the assembling process, after being assembled, or the panel is stored or used for a long time, so that the product yield is increased and the product stability of the display panel is significantly improved. The display panel in the embodiment may be applied to any display product. Because the flexible printed circuit board (e.g., COF) bent to the back of the display panel is free from the problem of the scrapped position connected to the base, the display panel in the embodiment is also suitable for display products with full-screen display without borders.

In other embodiments, for example, known members of the element having different configurations, arrangements or the like may also be applied, and can be appropriately adjusted or modified according to the actual requirement and condition of application. For example, although the mechanical strengthening element (e.g., the glue) is disposed in correspondence with the side edge corners (e.g., the first corner 505C1 and the second corner 505C2) of the flexible printed circuit board in the drawings of the above-mentioned embodiments, this disclosure is not restricted thereto. In the embodiment, the mechanical strengthening element can be provided at the locations of the base where the high stress is generated according to the application aspects, and these locations pertain to the application of this disclosure. Therefore, the structure shown in the specification and drawings is for illustrative purposes and is not intended to limit the scope of this disclosure. In addition, those skilled in the art should understand that the shape, position, and material of the constituent members, inclusive of the formation methods, in the embodiments are not limited to the aspects described or illustrated in the drawings, and may also be adjusted according to the needs and/or manufacturing steps of the actual application without departing from the spirit of the disclosure.

While the disclosure has been described by way of example and in terms of the embodiments, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display panel, comprising: a first base, having a first surface and a second surface, the first surface and the second surface disposed oppositely; a flexible printed circuit board, disposed directly on the first surface of the first base and bent toward the second surface of the first base, wherein at least a portion of the flexible printed circuit board faces the second surface of the first base; another circuit board, directly connected to the flexible printed circuit board without being connected to the first base; and a mechanical strengthening element, disposed directly on the second surface of the first base, and the mechanical strengthening element at least positioned at regions of the second surface corresponding to two side edges of the flexible printed circuit board.

2. The display panel according to claim 1, wherein the flexible printed circuit board is disposed on an outer lead bonding area of the first base, wherein a ratio of a width of the mechanical strengthening element to a width of the outer lead bonding area of the first base ranges from 0.8 to 2.0.

3. The display panel according to claim 1, wherein the flexible printed circuit board is disposed on an outer lead bonding area of the first base, wherein a ratio of a length of the mechanical strengthening element to a width of the outer lead bonding area of the first base ranges from 3 to 8.

4. The display panel according to claim 1, wherein the mechanical strengthening element has a width ranging from 3 mm to 5 mm, and a length ranging from 15 mm to 18 mm.

5. The display panel according to claim 1, wherein in a cross-sectional view, the mechanical strengthening element has at least one arced protrusion.

6. The display panel according to claim 1, wherein in a top view of the mechanical strengthening element, at least a portion of a shape of the mechanical strengthening element is arced.

7. The display panel according to claim 6, wherein the shape of the mechanical strengthening element has a circular tail end or a cuspidal tail end.

8. The display panel according to claim 1, comprising a lower polarizer disposed on the second surface of the first base, wherein the mechanical strengthening element neighbors the lower polarizer and is separated from the lower polarizer by at least a distance.

9. The display panel according to claim 1, comprising a lower polarizer disposed on the second surface of the first base, wherein the mechanical strengthening element contacts one side surface of the lower polarizer.

10. The display panel according to claim 9, comprising a second base and an upper polarizer, wherein the second base and the first base are disposed oppositely, and the upper polarizer is disposed on the second base, wherein a width of the lower polarizer is smaller than a width of the upper polarizer.

11. The display panel according to claim 1, comprising a second base and an upper polarizer, wherein the second base and the first base are disposed oppositely, wherein the second base is a protection layer.

12. The display panel according to claim 1, at least a portion of the first base is arced.

13. The display panel according to claim 12, wherein in a top view of the first base, the first base comprises a first lateral side and a second lateral side disposed oppositely, and the first lateral side of the first base has a different curvature from the second lateral side of the first base.

14. The display panel according to claim 12, wherein one side of the first base has at least two different curvatures.

15. The display panel according to claim 1, wherein the flexible printed circuit board has a first side edge and a second side edge opposite to the first side edge and a third side edge; two connecting ends of the third side edge are respectively connected to the first side edge and the second side edge; the third side edge, a portion of the first side edge and a portion of the second side edge overlap with the first base in the top view of the first base; and the mechanical strengthening element is at least positioned at a first corner corresponding to one of the connecting ends between the first side edge of flexible printed circuit board and the third side edge of the flexible printed circuit board, and a second corner corresponding to the other one of the connecting ends between the second side edge and the third side edge.

16. A method of assembling a display device, comprising: providing a protection member; providing a display panel, which comprises a first base having a first surface and a second surface, and the first surface of the first base and the second surface of the first base are disposed oppositely, wherein a flexible printed circuit board is disposed directly on the first surface of the first base, and at least a portion of the flexible printed circuit board faces the second surface of the first base; providing another circuit board, directly connected to the flexible printed circuit board without being connected to the first base; bonding the display panel to the protection member; disposing a mechanical strengthening element directly on the second surface of the first base, wherein the mechanical strengthening element is at least positioned at regions corresponding to two side edges of the flexible printed circuit board; and bending the flexible printed circuit board backwardly toward the second surface of the first base after the mechanical strengthening element is disposed.

17. The method according to claim 16, wherein the protection member at least has a curved surface, the display panel provided is a flat display panel, and the display panel is bonded toward the protection member having the curved surface upon bonding.

18. The method according to claim 16, wherein the mechanical strengthening element is a glue, and the glue is one of a light curing glue, a heat curing glue, or a chemical reaction curing glue.

19. The method according to claim 16, wherein after the mechanical strengthening element is disposed, an ultraviolet light source is provided to irradiate and cure the mechanical strengthening element.

20. The method according to claim 16, wherein the flexible printed circuit board is disposed on an outer lead bonding area of the first base, wherein a ratio of a width of the mechanical strengthening element to a width of the outer lead bonding area of the first base ranges from 0.8 to 2.0.

* * * * *